United States Patent [19]
Yata et al.

[11] Patent Number: 6,147,042
[45] Date of Patent: Nov. 14, 2000

[54] DETERGENT FOR PROCESSES FOR PRODUCING SEMICONDUCTOR DEVICES OR PRODUCING LIQUID CRYSTAL DEVICES

[75] Inventors: Takashi Yata, Saitama; Yutaka Koinuma, Ibaraki; Kazunori Fukumura; Yoshihito Fukumura, both of Tokushima, all of Japan

[73] Assignees: Kishimoto Sangyo Co., Ltd.; Otsuka Chemical Co., Ltd., both of Osaka, Japan

[21] Appl. No.: 09/269,735

[22] PCT Filed: Aug. 4, 1998

[86] PCT No.: PCT/JP98/03458

§ 371 Date: Jul. 2, 1999

§ 102(e) Date: Jul. 2, 1999

[87] PCT Pub. No.: WO99/07010

PCT Pub. Date: Nov. 2, 1999

[30] Foreign Application Priority Data

Aug. 4, 1997 [JP] Japan ................ 9-221980
Nov. 25, 1997 [JP] Japan ................ 9-339342

[51] Int. Cl.$^7$ ................ C11D 3/06; C11D 7/18
[52] U.S. Cl. ............ 510/175; 510/178; 510/245; 510/501; 510/510; 510/534; 134/1.2; 134/1.3; 134/40

[58] Field of Search .................. 510/175, 178, 510/245, 501, 510, 534; 134/1.2, 1.3, 40

[56] References Cited

U.S. PATENT DOCUMENTS 3,990,977 11/1976 Pearson .................. 252/8.1
4,331,437 5/1982 Remley .................. 8/115.7

FOREIGN PATENT DOCUMENTS 148112 1/1986 Poland .

*Primary Examiner*—Yogendra Gupta
*Assistant Examiner*—Charles Boyer
*Attorney, Agent, or Firm*—Oblon, Spivak, McClelland, Maier & Neustadt, P.C.

[57] ABSTRACT

The cleaner of the present invention contains, as an active ingredient, a polyphosphoric-acid-urea condensate or phosphoric-acid-urea polymer which is a reaction product from orthophosphoric acid and urea and is used for cleaning a metal surface and/or a glass surface in at least one process of a semiconductor device production process and a liquid crystal device production process. According to the present invention, an etching residue and impurities on metal (including semimetal) and glass surfaces can be cleaned off with high environmental and working safety and effectively without causing the problem of metal corrosion.

9 Claims, 3 Drawing Sheets

(x 100,000)

(x 100,000)

5 μm

5 μm

5 μm

DETERGENT FOR PROCESSES FOR PRODUCING SEMICONDUCTOR DEVICES OR PRODUCING LIQUID CRYSTAL DEVICES

This application is a 371 of PCT/JP 98/03458 filed Aug. 4, 1998.

TECHNICAL FIELD

The present invention relates to a cleaner for a semiconductor device production process or for a liquid crystal device production process, which is used for cleaning a metal or glass surface in the semiconductor device production process and the liquid crystal device production process.

TECHNICAL BACKGROUND

For washing wafers, etc., in the process of the production of semiconductor devices of silicon and compounds such as GaAs or in the process of the production of liquid crystal devices (LCD), and for removing dry-etching residual substance (residue) in the above processes, there are used strong acids (hydrochloric acid, sulfuric acid, nitric acid and fluoric acid), strong alkalis (sodium hydroxide, ammonia, hydrazine and hydroxylamine), ammonium fluoride, alkanolamines, organic solvents, and the like.

The above substances are all deleterious substances or hazardous substances and involve many problems in respect of working and environmental safety.

More specifically, for the removal of impurity ion, particles, an organic substance and an oxide layer on a metal (including a semimetal such as silicon) surface or a glass surface of a wafer, etc., in the above processes, there is required a complicated process (so-called RCA process) according to an object to be removed, in which a chemical such as a strong acid, a strong alkali or the like is used depending upon the object and cleaning is repeated. These chemicals involve problems in respect of both operability and safety.

For removing a dry etching residue, further, there is used hydroxylamine, tetramethylammonium hydroxide (TMAH), ammonium fluoride, alkanolamine, a mixture of an organic solvent with any one of these compounds, or an organic solvent itself, while these compounds have a problem in view of working safety or environmental pollution. Further, when the material of an object to be treated is a metal, the above compounds have another problem that they remain in the metal to corrode the metal.

DISCLOSURE OF THE INVENTION

It is an object of the present invention to provide a cleaner for a semiconductor device production process or for a liquid crystal device production process, which has high environmental and working safety and which makes it possible to clean a metal (including semimetal) or glass surface of an etching residue, impurities, etc., effectively without causing the problem of metal corrosion in a semiconductor device production process or a liquid crystal device production process.

The above object is achieved by any one of the following cleaners.

(1) A cleaner for a semiconductor device production process or for a liquid crystal device production process, which contains a polyphosphoric-acid-urea condensate or phosphoric-acid-urea polymer which is a reaction product from orthophosphoric acid and urea, and water, and which is for use for cleaning a metal and/or glass surface in at least one process of a semiconductor device production process and a liquid crystal device production process.

(2) The cleaner for a semiconductor device production process or for a liquid crystal device production process, according to the above (1), which contains, as an active ingredient, the polyphosphoric acid-urea condensate or phosphoric acid-urea polymer obtained by reacting an orthophsphoric acid with urea in an orthophosphoric acid:urea molar ratio of 1:1 to 1:5.

(3) The cleaner for a semiconductor device production process or for a liquid crystal device production process, according to the above (1) or (2), which contains 0.01 to 60% by weight of the polyphosphoric acid-urea condensate or phosphoric acid-urea polymer which is a reaction product from orthophosphoric acid and urea.

(4) The cleaner for a semiconductor device production process or for a liquid crystal device production process, according to any one of the above (1) to (3), which further contains hydrogen peroxide.

(5) The cleaner for a semiconductor device production process or for a liquid crystal device production process, according to any one of the above (1) to (4), which is for use for the removal of a dry etching residue.

(6) The cleaner for a semiconductor device production process or for a liquid crystal device production process, according to the above (5), wherein the dry etching residue contains an organometal and/or a metal oxide formed from the organometal.

(7) The cleaner for a semiconductor device production process or for a liquid crystal device production process, according to any one of the above (1) to (4), which is for use for cleaning a wafer.

(8) The cleaner for a semiconductor device production process or for a liquid crystal device production process, according to the above (7), which is for use for cleaning off metal ion and/or halide ion.

JP-A-8-132093 discloses a cleaner composition containing, as active ingredients, hydrogen peroxide, an ammonium phosphate condensate and a urea compound. The above Publication discloses the removal of scales and slime. Differing from the present invention, however, it discloses nothing concerning the use of the above composition for cleaning off an etching residue or impurities on a metal or glass surface in the semiconductor device production process or the liquid crystal device production process, and it is not at all possible to infer the effect of the present invention on the basis of the above Publication. Further, JP-B-59-5670 discloses a water-soluble metal cleaner containing an ammonium phosphate condensate as a main cleaner ingredient and containing urea or its modified component as an auxiliary agent. Differing from the present invention, however, it discloses nothing concerning the use of the above cleaner for cleaning off an etching residue or impurities on a metal or glass surface in the semiconductor device production process or the liquid crystal device production process, and it is not at all possible to infer the effect of the present invention on the basis of the above Publication.

BEST MODES FOR PRACTICING THE INVENTION

Figure 1:
FIG. 1 is an SEM photograph of a silicon wafer treated with a cleaner of the present invention (having a polyphosphoric-acid-urea condensate concentration of 40% by weight).

The present invention will be explained in detail hereinafter.

The cleaner for a semiconductor device production process and for a liquid crystal device production process, provided by the present invention, contains, as a main active ingredient, a polyphosphoric-acid-urea condensate or phosphoric-acid-urea polymer which is a reaction product from orthophosphoric acid and urea and contains water as a solvent. Being a cleaner containing a less toxic compound alone, the cleaner of the present invention is preferred in view of environmental and working safety.

Further, in a semiconductor device production process or in a liquid crystal device (LCD) production process, the cleaner of the present invention can remove all of substances which deteriorate device characteristics, such as impurity ions (e.g., ions of metals such as Na, K, Ca, Al, Fe, Ni and Cu and ions of halogens such as chlorine), particles, an organic substance and an oxide layer on the surface of a silicon wafer or a glass substrate, not by carrying out a complicated step but by only bringing the above surface into contact with the cleaner. Further, it can remove an etching residue containing an organometal formed during the dry etching in the above production process and a metal oxide formed from the above organometal due to oxygen plasma ashing treatment for removing a resist.

Further, the cleaner of the present invention is free of a problem that it remains in a metal, etc., to be treated and corrodes the metal.

That is, the cleaner for a semiconductor device production process and for a liquid crystal device production process, provided by the present invention, is promising for use as:

1) a remover liquid for removing a dry etching residue,
2) a substitute for a chemical liquid used for so-called RCA cleaning for removing impurities such as metal and halogen ions on a silicon wafer, etc.,
3) a cleaner liquid for scrubbing a wafer, etc.,
4) a cleaner liquid for cleaning a wafer, etc., after a CMP (chemico-mechanical polishing) process, and
5) a cleaner liquid for cleaning a glass substrate for use in a liquid crystal device.

In particular, the cleaner of the present invention is preferred for use in the above 1) and 2). In the above 2), it is no longer required to repeat the steps of cleaning with liquid chemicals selected for each purpose in conventional RCA cleaning, liquid chemicals containing deleterious substances or hazardous substances such as sulfuric acid, ammonia, hydrochloric acid or fluoric acid and washing with water. All the impurities, etc., can be removed with the cleaner of the present invention alone.

The cleaner for a semiconductor device production process and for a liquid crystal device production process, provided by the present invention, contains a polyphosphoric-acid-urea condensate or phosphoric acid-urea polymer as an active ingredient. The polyphosphoric-acid-urea condensate or phosphoric-acid-urea polymer, which is a reaction product from orthophosphoric acid and urea and is contained, as an active ingredient, in the cleaner for a semiconductor device production process and for a liquid crystal device production process, provided by the present invention, is a known product formed by the condensation of orthophosphoric acid and urea. The reaction in the above condensation is preferably carried out under conditions where the orthophosphoric acid:urea molar ratio is 1:1 to 1:5. The condensation degree of the polyphosphoric-acid-urea condensate or phosphoric-acid-urea polymer which is a reaction product from orthophosphoric acid and urea is not specially limited, while the above condensation degree is generally approximately 3 to 150, preferably approximately 8 to 50.

Besides these, there may be a salt of the polyphosphoric-acid-urea condensate or phosphoric-acid-urea polymer and a product in which an alkali which neutralizes the polyphosphoric-acid-urea condensate or phosphoric-acid-urea polymer which is a reaction product from orthophosphoric acid and urea and the polyphosphoric-acid-urea condensate or phosphoric-acid-urea polymer which is a reaction product from orthophosphoric acid and urea bond to each other. The above salt or the above product includes ammonium salt, hydrazine salt, hydroxylamine salt, alkanolamine salt, cyclohexylamine salt, cyclic amine salt, potassium salt and sodium salt of the polyphosphoric-acid-urea condensate or phosphoric-acid-urea polymer which is a reaction product from orthophosphoric acid and urea. The above polyphosphoric-acid-urea condensates or phosphoric-acid-urea polymers which are reaction products from orthophosphoric acid and urea may be used alone or in combination.

While the content of the polyphosphoric-acid-urea condensate or phosphoric-acid-urea polymer which is a reaction product from orthophosphoric acid and urea is generally 0.01 to 60% by weight, it may be changed depending upon fields where it is used and conditions under which it is used.

When the cleaner of the present invention is used for cleaning a silicon wafer or a glass substrate, i.e., a substrate having no metal layer where almost no influence is caused on a metal, in particular, when there is a contact hole, the above content may be 5 to 60% by weight, particularly, 10 to 60% by weight. When the above content exceeds the above upper limit, no further improvement is observed, and it is disadvantageous in view of a cost performance. When the above content is less than the above lower limit, the cleaning power is low.

However, the above amount in use brings an environmental problem, e.g., an effluent disposal problem. The above content is therefore preferably 10% by weight or less. Further, for example, in a substrate having metal layers of Si/Ti/TiN/Al/TiN, etc., there is a problem that Al or other metals having a low melting point such as Cu, Ni, etc., is/are liable to be corroded with an increase in the content of the polyphosphoric-acid-urea condensate or phosphoric acid-urea polymer. In the above case, even when the content of the polyphosphoric-acid-urea condensate or phosphoric-acid-urea polymer is 0.1% by weight or less, a sufficient cleaning effect can be obtained and the degree of metal corrosion is low. The above content is 0.01 to less than 10% by weight, preferably 0.01 to less than 5% by weight, more preferably 0.05 to 4.5% by weight. When the content of the polyphosphoric-acid-urea condensate or phosphoric-acid-urea polymer is within the above range, and in particular when a line width is in the range of about sub-micron, e.g., 0.1 μm to less than 1 μm, the "eating" of a metal layer is effectively prevented.

The water to be contained in the cleaner of the present invention is not specially limited, and it can be selected from tap water, ground water, deionized water or pure water, and of these, deionized water and pure water are preferred.

The amount of water can constitute a balance other than the amount of the chemical component.

The cleaner of the present invention may contain hydrogen peroxide. The hydrogen peroxide serves to improve cleaning power, so that a treatment temperature and the time period of treatment can be therefore decreased.

The hydrogen peroxide can be selected from hydrogen peroxide per se, known compounds which can release hydrogen peroxide in water and a mixture of these.

Although not specially limited, the content of the hydrogen peroxide is preferably 1 to 30% by weight, more preferably 5 to 25% by weight.

In addition to the above, the cleaner of the present invention may further contain urea or a urea derivative (biuret and triuret), various surfactants (nonionic, cationic, anionic and amphoteric), and a chelating agent (ethylenediamine tetraacetic acid: EDTA, etc.).

In cleaning in the fields of a semiconductor and a liquid crystal, impurities, particularly, iron, sodium and potassium influence the characteristics of a device. The cleaner of the present invention can be therefore prepared so as to have such a product quality that the impurities are decreased to a predetermined level or lower depending upon fields where it is used. For example, the impurities can be removed from the cleaner of the present invention by electric dialysis, or the like.

The cleaning with the cleaner of the present invention is carried out by bringing the cleaner liquid and an object to be treated into contact with each other. The above contact may be carried out by a method in which the cleaner is sprayed to that portion of the object which is to be treated. Preferably, the object to be treated is immersed in the cleaner of the present invention filled in a tank. In the treatment in the tank, it is preferred to stir or agitate the cleaner.

Although the temperature at which the cleaner is brought into contact and the time period for which the cleaner is kept in contact differ depending upon the properties of a substance to be cleaned off and an object to be treated, it is sufficient to keep the object and the cleaner in contact with each other at a temperature of approximately 15 to 100° C. for approximately 2 to 60 minutes.

In the treatment in a tank, for maintaining the cleaning effect at a constant level, the entire cleaner in the tank may be replaced with a new cleaner at regular intervals of predetermined treatment in a batch treatment. In a continuous treatment, the cleaner may be discharged at a predetermined rate at regular intervals of predetermined treatment by an overflow with the supplement of a new cleaner (supplement liquid).

The volume of the tank for the treatment is approximately 20 to 300 liters.

An object which has been cleaned with the cleaner of the present invention is preferably further washed with water, or it may be dried and directly used without washing it with water.

EXAMPLES

The present invention will be more specifically explained with reference to Examples hereinafter.

Example 1

A positive photoresist layer of a novolak resin material was formed on a silicon oxide layer of a 630 μm thick silicon wafer (oxide layer wafer) having a diameter of 6 inches, the photoresist was patterned for forming a contact hole, and then, plasma etching was carried out. As an etching gas, a chlorine-containing gas and a fluorine-containing gas were used. After the etching, the photoresist was removed by oxygen plasma ashing.

Then, the wafer was cleaned by immersing it in a cleaner, which was an aqueous solution (deionized water was used as water) having a polyphosphoric-acid-urea condensate concentration shown in Table 1 and was filled in a tank having a volume of 20 liter, at a treat temperature shown in Table 1 for a treatment time shown in Table 1. The tank was provided with a stirrer within it, and the treatment was carried out with stirring the cleaner at 70 to 75 rpm.

Figure 2:
FIG. 2 is an SEM photograph of an untreated silicon wafer.

FIG. 1 shows a scanning electron microscope (SEM) photograph of a wafer which was treated with a cleaner of a 40 wt % aqueous solution under conditions of 65° C. and 20 minutes, and FIG. 2 shows a scanning electron microscope (SEM) photograph of an untreated wafer.

It is seen from FIGS. 1 and 2 that the treatment with the cleaner of the present invention fully removes an etching residue in the hole.

Further, surfaces of wafers treated under conditions shown in Table 1 were evaluated on the basis of scanning electron microscope (SEM) photographs. Table 1 shows the results including the result shown in FIG. 1. The evaluation results of a cleaning effect are expressed by ○ (the removal of etching residue is complete, i.e., at the same level as that in FIG. 1) and × (the removal of etching residue was incomplete).

TABLE 1

| Concentration of polyphosphoric-acid-urea condensate (aqueous solution wt %) | Treatment temperature (° C.) | Treatment time (minute) | Cleaning effect |
| --- | --- | --- | --- |
| 1 | 100 | 20 | ○ |
| 5 | 100 | 15 | ○ |
| 10 | 65 | 20 | ○ |
| 20 | 65 | 20 | ○ |
| 40 | 65 | 20 | ○ |
| 60 | 65 | 20 | ○ |

Table 1 shows that the treatment with the cleaner of the present invention can produce an excellent cleaning effect.

Example 2

The same object as that used in Example 1 was cleaned with a cleaner which was an aqueous solution containing a polyphosphoric-acid-urea condensate and hydrogen peroxide as shown in Table 2, at a treatment temperatue shown in Table 2 for a treatment time shown in Table 2, and cleaning results were evaluated in the same manner as in Example 1. Table 2 shows the results.

TABLE 2

| Concentration of polyphosphoric-acid-urea condensate (aqueous solution wt %) | Amount of $H_2O_2$ (aqueous solution wt %) | Treatment temperature (° C.) | Treatment time (minute) | Cleaning effect |
| --- | --- | --- | --- | --- |
| 5 | 20 | 65 | 20 | ○ |
| 20 | 15 | 50 | 20 | ○ |
| 40 | 10 | 40 | 20 | ○ |
| 40 | 20 | 20 | 20 | ○ |
| 60 | 5 | 35 | 20 | ○ |

Table 2 shows that sufficient cleaning effects can be produced due to the addition of hydrogen peroxide even when the treatment temperature is decreased.

Example 3

A positive photoresist layer of a novolak resin was formed on a 630 μm thick Si/Ti/TiN/Al/TiN laminated substrate having a diameter of 6 inches, the photoresist was patterned, and then, plasma etching was carried out. As an etching gas, a chlorine-containing gas and a fluorine-containing gas were used. After the etching, the photoresist was removed by oxygen plasma ashing.

Then, the laminated substrate was subjected to cleaning treatment with a cleaner having the composition shown in Example 1 under conditions shown in Table 3, and then washed with water.

In this case, the cleaner was filled in a 20-liter tank with a cover for the above treatment. Further, pure water was filled in a tank having the same volume as the above, to carry out the above washing with water at 25° C. for 5 minutes.

Figure 3:
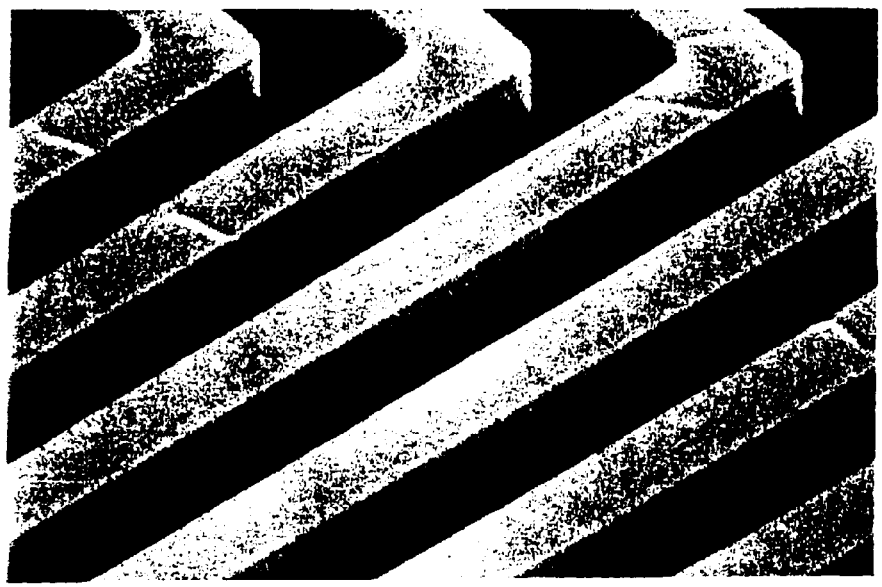
FIG. 3 is an SEM photograph of an Si/Ti/TiN/Al/TiN laminated substrate treated with a cleaner of the present invention (having a polyphosphoric-acid-urea condensate concentration of 0.5% by weight).
Figure 4:
FIG. 4 is an SEM photograph of an Si/Ti/TiN/Al/TiN laminated substrate treated with a cleaner of the present invention (having a polyphosphoric-acid-urea condensate concentration of 40% by weight).
Figure 5:
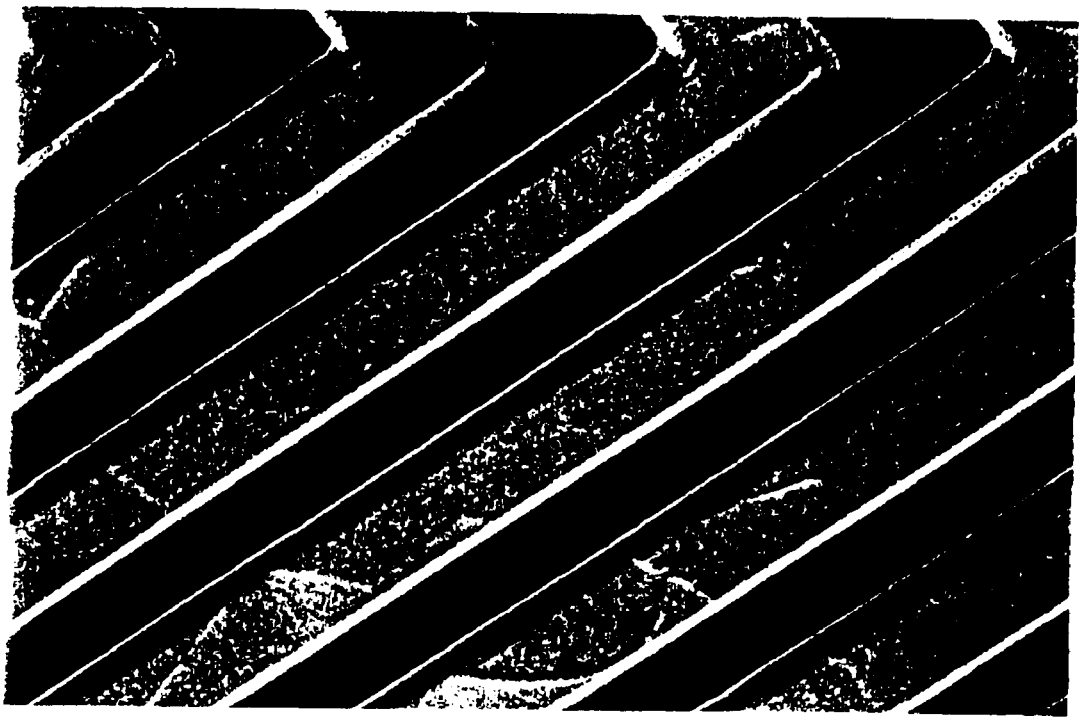
FIG. 5 is an SEM photograph of an untreated Si/Ti/TiN/Al/TiN laminated substrate.

Of the so-treated laminated substrates, FIG. 3 shows an SEM photograph of the laminated substrate treated with a cleaner of a 0.5 wt % aqueous solution under conditions of 65° C., and 20 minutes, FIG. 4 shows an SEM photograph of the laminated substrate treated with a cleaner of a 40 wt % aqueous solution under conditions of 65° C. and 20 minutes, and FIG. 5 shows an SEM photograph of an untreated laminated substrate.

FIGS. 3 to 5 show that when the content of the polyphosphoric-acid-urea condensate or phosphoric-acid-urea polymer is large, the metal Al is corroded but that when the above content is low, almost no corrosion takes place, and further an etching residue is fully cleaned off.

Further, the laminated substrates treated under the conditions shown in Table 3 were evaluated for surfaces in which a narrow line and a space/line of 0.35 $\mu$m/0.35 $\mu$m were formed, on the basis of scanning electron microscope (SEM) photographs thereof. Table 3 shows the results. The evaluation results of the metal corrosion are expressed by ○ (no metal corrosion was observed), Δ (slight metal corrosion was observed) and × (metal corrosion was observed).

TABLE 3

| Concentration of polyphosphoric-acid-urea condensate (aqueous solution wt %) | Treatment temperature (° C.) | Treatment time (minute) | Metal corrosion |
| --- | --- | --- | --- |
| 0.1 | 65 | 20 | ○ |
| 0.5 | 65 | 20 | ○ |
| 1 | 65 | 20 | ○ |
| 5 | 65 | 20 | Δ |
| 10 | 65 | 20 | × |
| 20 | 65 | 20 | × |
| 40 | 65 | 20 | × |
| 60 | 65 | 20 | × |

Table 3 shows that when a composition of the cleaner and treatment conditions are selected, almost no metal corrosion is caused and an excellent cleaning effect can be obtained.

Example 4

An untreated silicon bare wafer having a diameter of 6 inches and a thickness of 630 $\mu$m was used as a sample. As shown in Table 4, the sample was tested in a cleaning apparatus with a chemical concentration shown in Table 4 at a predetermined temperature shown in Table 4. In this case, an amount of metal impurities (Na, Mg, Ca, Al, Fe, Ni, Cu) on the wafer surface was measured with a total reflection fluorescent X-ray analyzer.

The amount of the metal impurities before the cleaning was $10^{12}$ to $10^{13}$ pieces-atoms (each atom of the above elements) per cm$^2$ of the wafer.

Table 4 shows the results.

TABLE 4

| Concentration of polyphosphoric-acid-urea condensate (aqueous solution wt %) | Treatment Temperature (° C.) | Treatment time (minute) | Amount of metal impurities (pieces-atom/cm$^2$) |
| --- | --- | --- | --- |
| 5 | 80 | 20 | $10^{10-11}$ (each atom of Na, Mg, Ca, Al, Fe, Ni, Cu) |
| 10 | 80 | 20 | $10^{10-11}$ (each atom of Na, Mg, Ca, Al, Fe, Ni, Cu) |
| 20 | 80 | 20 | $10^{10-11}$ (each atom of Na, Mg, Ca, Al, Fe, Ni, Cu) |
| 40 | 80 | 20 | $10^{10-11}$ (each atom of Na, Mg, Ca, Al, Fe, Ni, Cu) |

Table 4 shows that metal impurities which have a detrimental influence on a device can be decreased in amount by the cleaning.

Example 5

The same untreated oxide layer wafer as that used in Example 1 was used as a sample, and as shown in Table 5, the sample was tested in a cleaning apparatus (overflow type cleaning apparatus) with a chemical concentration shown in Table 5 at a predetermined temperature shown in Table 5. Particles (at least 0.3 $\mu$m) on the wafer were measured for a number with a surface scanning type particle counter.

For the number of particles, particles having a maximum length of at least 0.3 $\mu$m were counted, and the result is shown by the number of particles per a wafer diameter of 6 inches (pieces-at least 0.3 $\mu$m/6 inches). In this case, particles having a maximum length of 0.3 to 0.5 $\mu$m were counted. The number of particles before the cleaning was 208 pieces-at least 0.3 $\mu$m/6 inches. The wafer was subjected to the above analysis after it was washed with pure water according to an overflow method (5 minutes).

TABLE 5

| Concentration of polyphosphoric-acid-urea condensate (aqueous solution wt %) | Treatment temperature (° C.) | Treatment time (minute) | Number of particles (pieces-at least 0.3 $\mu$m/ 6 inches) |
| --- | --- | --- | --- |
| 5 | 80 | 20 | 55 |
| 10 | 80 | 20 | 32 |
| 20 | 80 | 20 | 8 |
| 40 | 80 | 20 | 7 |

Table 5 shows that particles which have an detrimental influence on a device can be decreased in number by the cleaning.

Example 6

The same test as that in Example 5 was carried out except that conditions shown in Table 6 were employed and that an untreated glass substrate (400 mm×500 mm) for LCD was treated.

For the number of particles, particles having a maximum length of at least 0.5 μm were counted, and the result is shown by the number of particles per 400 mm×500 mm (pieces-at least 0.5 μm/400 mm×500 mm). In this case, particles having a maximum length of 0.5 to 1.0 μm were counted. The number of particles before the cleaning was 320 pieces-at least 0.5 μm/400 mm×500 mm. Table 6 shows the results.

TABLE 6

| Concentration of polyphosphoric-acid-urea condensate (aqueous solution wt %) | Treatment Temperature (° C.) | Treatment time (minute) | Number of particles (pieces-at least 0.5 μm/400 mm × 500 mm) |
|---|---|---|---|
| 5 | 65 | 20 | 23 |
| 10 | 65 | 20 | 18 |

Table 6 shows that particles which have an detrimental influence on a device can be decreased in number by the cleaning.

EFFECT OF THE INVENTION

According to the present invention, an etching residue, impurities, etc., on a metal (including semi-metal) or glass surface in a semiconductor device production process or a liquid crystal device production process can be effectively cleaned off. Further, there is no detrimental influences on an object to be cleaned, such as the corrosion of a metal.

What is claimed is:

1. A process for cleaning a metal and/or a glass surface comprising cleaning said surface with a cleaner which contains, as an active ingredient, a polyphosphoric acid-urea condensate or phosphoric acid-urea polymer, which is a reaction product of orthophosphoric acid and urea, wherein the surface is of a semi-conductor device or a liquid crystal device and wherein an etching residue containing an organometal formed during an etching process and a metal oxide formed from the organometal is removed.

2. The process according to claim 1, wherein the polyphosphoric acid-urea condensate or phosphoric acid-urea polymer is obtained by reacting an orthophosphoric acid with urea in an orthophosphoric acid:urea molar ratio of 1:1 to 1:5.

3. The process according to claim 1, wherein the cleaner is an aqueous solution of said active ingredient.

4. The process according to claim 3, wherein dry etching residue is cleaned from said surface.

5. The process according to claim 4, wherein the dry etching residue contains an organometal and/or a metal oxide formed from the organometal.

6. The process according to claim 3, wherein metal ion and/or halide ion is cleaned from said surface.

7. The process according to claim 3, wherein the cleaner additionally contains hydrogen peroxide.

8. The process according to claim 3, wherein the polyphosphoric acid-urea condensate or phosphoric-urea polymer is present in an amount of 0.01 to 60% by weight of the composition.

9. The process according to claim 7, wherein the hydrogen peroxide is present in an amount of 1 to 30% by weight of the composition.

* * * * *

UNITED STATES PATENT AND TRADEMARK OFFICE
CERTIFICATE OF CORRECTION

PATENT NO.    : 6,147,042
DATED         : November 14, 2000
INVENTOR(S)   : Takashi Yata, et al.

It is certified that error appears in the above-identified patent and that said Letters Patent is hereby corrected as shown below:

On the Title page, item [87] the Publication Date is incorrect, item [87] should read as follows:

Item --[87]
PCT Pub. No.:    WO99/07010
PCT Pub. Date:   Feb. 11, 1999

Signed and Sealed this

Nineteenth Day of June, 2001

*Attest:*

NICHOLAS P. GODICI
*Attesting Officer*    *Acting Director of the United States Patent and Trademark Office*